US010622574B2

(12) United States Patent
Gotanda

(10) Patent No.: US 10,622,574 B2
(45) Date of Patent: Apr. 14, 2020

(54) PHOTOELECTRIC CONVERSION ELEMENT AND METHOD FOR MANUFACTURING THE SAME

(71) Applicant: Kabushiki Kaisha Toshiba, Minato-ku (JP)

(72) Inventor: Takeshi Gotanda, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 95 days.

(21) Appl. No.: 15/069,294

(22) Filed: Mar. 14, 2016

(65) Prior Publication Data

US 2016/0276612 A1    Sep. 22, 2016

(30) Foreign Application Priority Data

Mar. 19, 2015    (JP) .................................. 2015-055876

(51) Int. Cl.
*H01L 51/42*    (2006.01)
*H01L 51/44*    (2006.01)
*H01L 51/00*    (2006.01)

(52) U.S. Cl.
CPC ........ *H01L 51/445* (2013.01); *H01L 51/4226* (2013.01); *H01L 51/0003* (2013.01); *H01L 51/0037* (2013.01); *H01L 51/0056* (2013.01); *H01L 2251/308* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| 2013/0319529 A1* | 12/2013 | Tsuda ................... H01G 9/2013 |
| | | 136/263 |
| 2015/0083226 A1* | 3/2015 | Arai .................... H01L 51/0053 |
| | | 136/263 |
| 2015/0249170 A1* | 9/2015 | Snaith ................... H01L 51/422 |
| | | 136/256 |

(Continued)

FOREIGN PATENT DOCUMENTS

| JP | 2013-211149 A | 10/2013 |
| JP | 2014-49551 | 3/2014 |

(Continued)

OTHER PUBLICATIONS

Solaronix "Safety data sheet" https://www.solaronix.com/msds/MSDS_Spiro-OMeTAD.pdf accessed Sep. 25, 2018 (Year: 2018).*

(Continued)

*Primary Examiner* — Magali P Slawski
(74) *Attorney, Agent, or Firm* — Oblon, McClelland, Maier & Neustadt, L.L.P.

(57) ABSTRACT

According to one embodiment, a photoelectric conversion element includes a photoelectric conversion layer, a first layer and an intermediate layer. The photoelectric conversion layer includes a material having a perovskite structure. The first layer includes a first substance and a second substance. The intermediate layer is provided between the photoelectric conversion layer and the first layer. A concentration of the second substance in the first layer is lower than a concentration of the first substance in the first layer.

13 Claims, 3 Drawing Sheets

(56) References Cited

U.S. PATENT DOCUMENTS

| | | | | |
|---|---|---|---|---|
| 2016/0013434 A1* | 1/2016 | Snaith | | H01L 51/4226 136/252 |
| 2016/0126019 A1* | 5/2016 | Lindstrom | | H01G 9/2031 136/263 |
| 2016/0285021 A1* | 9/2016 | Yang | | B05D 1/60 |

FOREIGN PATENT DOCUMENTS

| | | |
|---|---|---|
| JP | 2014-49596 | 3/2014 |
| JP | 2014-49631 | 3/2014 |
| JP | 2014-175472 A | 9/2014 |
| JP | 2014-175473 A | 9/2014 |
| WO | WO 2015/001459 A1 | 1/2015 |

OTHER PUBLICATIONS

Niu et al. "Study on the stability of $CH_3NH_3PbI_3$ films and the effect of post-modification by aluminum oxide in all-solid-state hybrid solar cells" J. Mater. Chem. A, 2014, 2, 705-710 | 705, first published Nov. 4, 2013 (Year: 2013).*

Burschka et al. "Tris(2-(1H-pyrazol-1-yl)pyridine)cobalt(III) as p-Type Dopant for Organic Semiconductors and Its Application in Highly Efficient Solid-State Dye-Sensitized Solar Cells" J. Am. Chem. Soc. 2011, 133, 18042-18045 (Year: 2011).*

Michael M. Lee, et al., "Efficient Hybrid Solar Cells Based on Meso-Superstructured Organometal Halide Perovskites" Science, vol. 338, Nov. 2, 2012, pp. 643-647 (with Supporting Online Material).

Jingbi You, et al., "Low-Temperature Solution-Processed Perovskite Solar Cells with High Efficiency and Flexibility" ACS Nano, vol. 8, No. 2, 2014, pp. 1674-1680 (with Supporting Information).

Agnese Abrusci, et al., "High-Performance Perovskite-Polymer Hybrid Solar Cells via Electronic Coupling with Fullerene Monolayers" Nano Letters, vol. 13, 2013, pp. 3124-3128.

Dianyi Liu, et al., "Perovskite solar cells with a planar heterojunction structure prepared using room-temperature solution processing techniques" Nature Photonics, vol. 8, Feb. 2014, pp. 133-138 (with Supplementary Information).

* cited by examiner

PHOTOELECTRIC CONVERSION ELEMENT AND METHOD FOR MANUFACTURING THE SAME

CROSS-REFERENCE TO RELATED APPLICATIONS

This application is based upon and claims the benefit of priority from Japanese Patent Application No. 2015-055876, filed on Mar. 19, 2015; the entire contents of which are incorporated herein by reference.

FIELD

Embodiments described herein relate generally to a photoelectric conversion element and a method for manufacturing the same.

BACKGROUND

Research has been made on photoelectric conversion elements such as solar cells and sensors using organic photoelectric conversion materials or photoelectric conversion materials including organic matter and inorganic matter. Devices may be manufactured at relatively low cost when photoelectric conversion elements are produced by printing or coating photoelectric conversion materials. It is desirable to increase conversion efficiency and improve endurance for such photoelectric conversion elements.

DETAILED DESCRIPTION

Figure 1A:
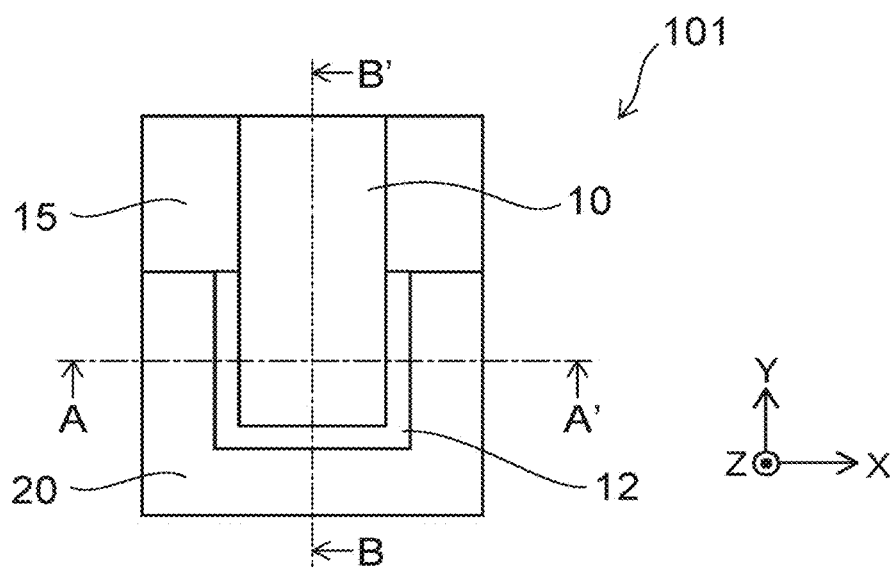
FIG. 1A to FIG. 1C are schematic views showing a photoelectric conversion element according to an embodiment.

According to one embodiment, a photoelectric conversion element includes a photoelectric conversion layer, a first layer and an intermediate layer. The photoelectric conversion layer includes a material having a perovskite structure. The first layer includes a first substance and a second substance. The intermediate layer is provided between the photoelectric conversion layer and the first layer. A concentration of the second substance in the first layer is lower than a concentration of the first substance in the first layer.

According to one embodiment, a method for manufacturing a photoelectric conversion element is disclosed. The element includes a photoelectric conversion layer, a first layer, and an intermediate layer provided between the photoelectric conversion layer and the first layer. The photoelectric conversion layer includes a material having a perovskite structure. The first layer includes a first substance and a second substance. A concentration of the second substance in the first layer is lower than a concentration of the first substance in the first layer. The method includes forming the intermediate layer by coating a precursor solution onto the photoelectric conversion layer. The method includes forming the first layer by coating a coating liquid onto the intermediate layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

Figure 1B:
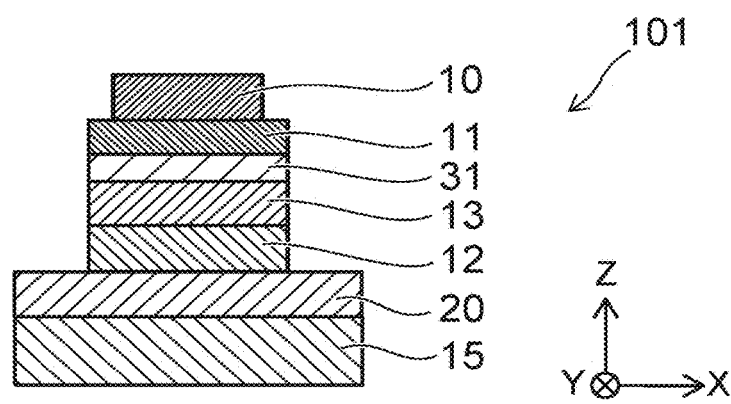
Figure 1C:
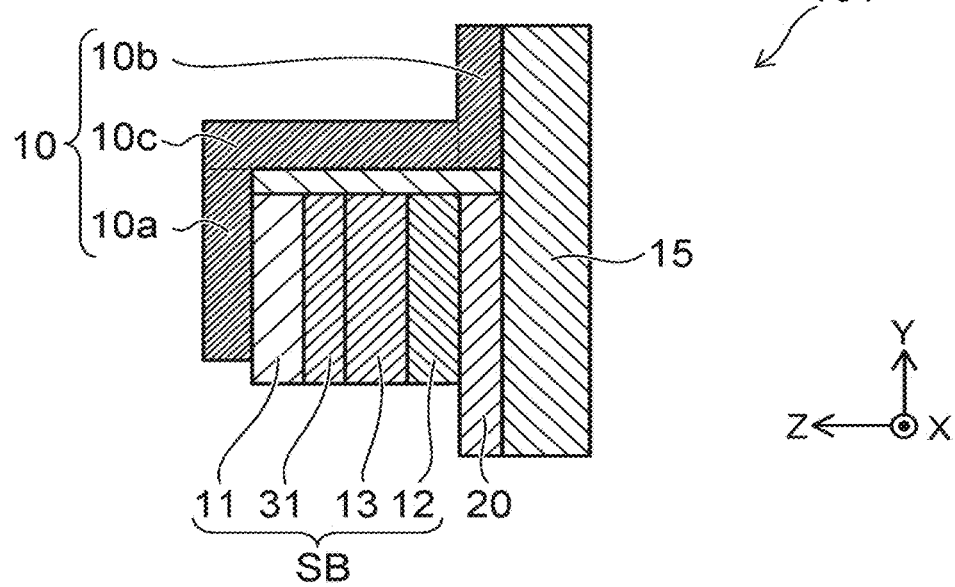

FIG. 1A to FIG. 1C are schematic views showing a photoelectric conversion element according to an embodiment.

FIG. 1A is a schematic plan view showing the photoelectric conversion element 101 according to the embodiment. FIG. 1B is a schematic cross-sectional view of the photoelectric conversion element 101 along cross-section A-A' shown in FIG. 1A. FIG. 1C is a schematic cross-sectional view of the photoelectric conversion element 101 along cross-section B-B' shown in FIG. 1A.

As shown in FIG. 1A to FIG. 1C, the photoelectric conversion element 101 includes a first layer 11, an intermediate layer 31, and a photoelectric conversion layer 13. The photoelectric conversion element 101 further includes a second layer 12, a first electrode 10, a second electrode 20, and a substrate 15. The photoelectric conversion element 101 is, for example, a solar cell or a sensor.

In this specification, a stacking direction from the photoelectric conversion layer 13 toward the first layer 11 is taken as a Z-axis direction. One direction perpendicular to the Z-axis direction is taken as an X-axis direction. A direction perpendicular to the X-axis direction and perpendicular to the Z-axis direction is taken as a Y-axis direction.

The second electrode 20 is provided on a portion of the substrate 15. The second electrode 20 is one selected from a positive electrode and a negative electrode.

The first electrode 10 is provided on the substrate 15 and is separated from the second electrode 20. The first electrode 10 is the other of the positive electrode or the negative electrode.

As shown in FIG. 1C, the first electrode 10 includes a first portion 10a, a second portion 10b, and a third portion 10c. The first portion 10a is provided on the second electrode 20 and is separated from the second electrode 20 in the Z-axis direction. For example, the first portion 10a is parallel to the second electrode 20. The second portion 10b is arranged with the second electrode 20 in the Y-axis direction. The third portion 10c is provided between the first portion 10a and the second portion 10b and is a portion that connects the first portion 10a to the second portion 10b.

The photoelectric conversion layer 13 is provided between the first electrode 10 (the first portion 10a) and the second electrode 20. The photoelectric conversion layer 13 includes a material having a perovskite structure.

The first layer 11 (a first buffer layer) is provided between the first electrode 10 (the first portion 10a) and the photoelectric conversion layer 13.

The second layer 12 (a second buffer layer) is provided between the second electrode 20 and the photoelectric conversion layer 13.

The first layer 11 and the second layer 12 are carrier transport layers that transport holes or electrons. At least one selected from the first layer 11 and the second layer 12 includes a dopant. Thereby, the transport properties of the carrier transport layer improve.

In the example, the first layer 11 is a doped carrier transport layer; and the first layer 11 is a carrier transport layer (a hole transport layer) that has hole transport properties. The second layer 12 is a carrier transport layer (an electron transport layer) that has electron transport properties.

The intermediate layer 31 is provided between the doped carrier transport layer and the photoelectric conversion layer 13. In other words, the intermediate layer 31 is provided between the first layer 11 and the photoelectric conversion layer 13. It is favorable for the intermediate layer 31 to include at least one selected from a metal oxide and thiocyanate. The intermediate layer 31 is a dopant blocking layer that suppresses the diffusion of the dopant of the first layer 11 toward the photoelectric conversion layer 13.

For example, light is incident on the photoelectric conversion layer 13 via the substrate 15, the second electrode 20, and the second layer 12. Or, the light is incident on the photoelectric conversion layer 13 via the first electrode 10, the first layer 11, and the intermediate layer 31. At this time, electrons or holes are excited in the photoelectric conversion layer 13 by the light that is incident.

The holes that are excited are extracted from the first electrode 10 via the first layer 11. The electrons that are excited are extracted from the second electrode 20 via the second layer 12. Thus, electricity that corresponds to the light incident on the photoelectric conversion element 101 is extracted via the first electrode 10 and the second electrode 20.

Members used in the photoelectric conversion element according to the embodiment will now be described in detail.

Substrate 15

The substrate 15 supports the other components (the first electrode 10, the second electrode 20, the first layer 11, the second layer 12, the intermediate layer 31, and the photoelectric conversion layer 13). An electrode may be formed on the substrate 15. It is favorable for the substrate 15 not to be altered by heat or organic solvents. The substrate 15 is, for example, a substrate including an inorganic material, a plastic substrate, a polymer film, a metal substrate, etc. Alkali-free glass, quartz glass, etc., may be used as the inorganic material. Polyethylene, polyethylene terephthalate (PET), polyethylene naphthalate (PEN), polyimide, polyamide, polyamide-imide, a liquid crystal polymer, a cycloolefin polymer, etc., may be used as the materials of the plastic and the polymer film. Stainless steel (SUS), titanium, silicon, etc., may be used as the material of the metal substrate.

In the case where the substrate 15 is disposed on the side of the photoelectric conversion element 101 where the light is incident, the substrate 15 includes a material (e.g., a transparent) material having a high light transmittance. In the case where the electrode (in the example, the first electrode 10) that is on the side opposite to the substrate 15 is transparent or semi-transparent, an opaque substrate may be used as the substrate 15. The thickness of the substrate 15 is not particularly limited as long as the substrate 15 has sufficient strength to support the other components.

In the case where the substrate 15 is disposed on the side of the photoelectric conversion element 101 where the light is incident, for example, an anti-reflection film having a moth-eye structure is mounted on the light incident surface. Thereby, the light is received efficiently; and it is possible to increase the energy conversion efficiency of the cell. The moth-eye structure is a structure including a regular protrusion array of about 100 nanometers (nm) in the surface. Due to the protrusion structure, the refractive index changes continuously in the thickness direction. Therefore, by interposing the anti-reflection film, a discontinuous change of the refractive index can be reduced. Thereby, the reflections of the light decrease; and the cell efficiency increases.

First Electrode 10 and Second Electrode 20

In the description relating to the first electrode 10 and the second electrode 20, simply "the electrode" refers to at least one selected from the first electrode 10 and the second electrode 20.

The material of the first electrode 10 and the material of the second electrode 20 are not particularly limited as long as the materials are conductive. A conductive material that is transparent or semi-transparent is used as the material of the electrode (e.g., the second electrode 20) on the side transmitting the light. The first electrode 10 and the second electrode 20 are formed by vacuum vapor deposition, sputtering, ion plating, plating, coating, etc. A conductive metal oxide film, a semi-transparent metal thin film, etc., may be used as the electrode material that is transparent or semi-transparent.

Specifically, a conductive oxide film or a metal film including gold, platinum, silver, copper, or the like is used as the electrode that is transparent or semi-transparent. Indium oxide, zinc oxide, tin oxide, a complex of these substances such as indium-tin-oxide (ITO), fluorine-doped tin oxide (FTO), indium-zinc-oxide, etc., may be used as the material of the conductive oxide film. It is particularly favorable for ITO or FTO to be used as the material of the conductive oxide.

In the case where the material of the electrode is ITO, it is favorable for the thickness of the electrode to be not less than 30 nm and not more than 300 nm. In the case where the thickness of the electrode is thinner than 30 nm, the conductivity decreases; and the resistance becomes high. A high resistance may cause the conversion efficiency to decrease. In the case where the thickness of the electrode is thicker than 300 nm, the flexibility of the ITO becomes low. Therefore, there are cases where the ITO breaks when stress is applied. It is favorable for the sheet resistance to be low; and it is favorable to be 10Ω/□ or less.

In the case where the electrode contacts the electron transport layer, it is favorable for a material having a low work function to be used as the material of the electrode. For example, an alkaline metal, an alkaline earth metal, etc., may be used as the material having the low work function. Specifically, Li, In, Al, Ca, Mg, Sm, Tb, Yb, Zr, Na, K, Rb, Cs, Ba, or an alloy of these elements may be used. The electrode may be a single layer or may have a structure in which layers including materials having different work functions are stacked.

An alloy of at least one selected from the materials having low work functions described above and at least one selected from gold, silver, platinum, copper, manganese, titanium, cobalt, nickel, tungsten, and tin may be used. Examples of the alloy include a lithium-aluminum alloy, a lithium-magnesium alloy, a lithium-indium alloy, a magnesium-silver alloy, a calcium-indium alloy, a magnesium-aluminum alloy, an indium-silver alloy, a calcium-aluminum alloy, etc.

In the case where the electrode contacts the hole transport layer, it is favorable for a material having a high work function to be used as the material of the electrode. For example, Au, Ag, Cu, or an alloy of these elements may be used as the material having the high work function. The electrode may be a single layer or may have a structure in which layers including materials having different work functions are stacked.

In the case where the electrode contacts the hole transport layer, a polythiophene polymer such as PEDOT (polyethylene dioxythiophene), etc., may be used as the material of the electrode. For example, Clevios PH 500, Clevios PH, Clevios PV P AI 4083, and Clevios HIL 1,1 of H. C. Starck are typical products of the polythiophene polymer.

In the case where the electrode includes the materials having low work functions recited above or the materials having high work functions recited above, it is favorable for the thickness of the electrode to be not less than 1 nm and not more than 500 nm. It is more favorable for the thickness of the electrode to be not less than 10 nm and not more than 300 nm. In the case where the thickness of the electrode is thinner than 1 nm, the resistance becomes too high; and there are cases where the charge that is generated cannot be conducted sufficiently to the external circuit. In the case where the thickness of the electrode is thicker than 500 nm, a long period of time is necessary to form the electrode. Therefore, the material temperature increases; and the performance may degrade due to damage to the other materials. Because a large amount of material is used, the time occupied by the apparatus (the film formation apparatus) that forms the electrode lengthens, which may increase the cost.

Photoelectric Conversion Layer 13

The photoelectric conversion layer 13 may include a material having a perovskite structure. For example, the perovskite structure is made of an ion A1, an ion A2, and an ion X and can be expressed by $A1A2X_3$. The structure may be a perovskite structure when the ion A2 is small compared to the ion A1. For example, the perovskite structure has a cubic unit lattice. The ion A1 is disposed at each corner of the cubic crystal; and the ion A2 is disposed at the body center. The ion X is disposed at each face center of the cubic crystal centered around the ion A2 at the body center.

The orientation of the $A2X_6$ octahedron distorts easily due to interactions with the ions A1. Due to the decrease of the symmetry, a Mott transition occurs; and valence electrons localizing at the ions M can spread as a band. It is favorable for the ion A1 to be $CH_3NH_3$. It is favorable for the ion A2 to be at least one selected from Pb and Sn. It is favorable for the ion X to be at least one selected from Cl, Br, and I. Each of the materials of the ion A1, the ion A2, and the ion X may be a single material or a mixed material. The thickness of the photoelectric conversion layer 13 is, for example, not less than 30 nm and not more than 1000 nm.

When coating the photoelectric conversion layer, a material is dissolved in a solvent. For example, an unsaturated hydrocarbon solvent, a halogenated aromatic hydrocarbon solvent, a halgenated saturated hydrocarbon solvent, an ether, etc., may be used as the solvent used when coating. Toluene, xylene, tetralin, decalin, mesitylene, n-butylbenzene, sec-butylbenzene, tert-butylbenzene, etc., may be used as the unsaturated hydrocarbon solvent. Chlorobenzene, dichlorobenzene, trichlorobenzene, etc., may be used as the halogenated aromatic hydrocarbon solvent. Carbon tetrachloride, chloroform, dichloromethane, dichloroethane, chlorobutane, bromobutane, chloropentane, chlorohexane, bromohexane, chlorocyclohexane, etc., may be used as the halgenated saturated hydrocarbon solvent. Tetrahydrofuran, tetrahydropyran, etc., may be used as the ether. It is more favorable to use a halogen aromatic solvent. DMF (N,N-dimethylformamide), 2-propanol, and γ-butyrolactone also may be used. It is possible to use these solvents independently or mixed. The solvent is not particularly constrained as long as the solvent can dissolve the material.

Spin coating, dip coating, casting, bar coating, roll coating, wire-bar coating, spraying, screen printing, gravure printing, flexographic printing, offset printing, gravure-offset printing, dispenser coating, nozzle coating, capillary coating, inkjet, etc., may be used as the method for forming the film or the layer by coating the solution. These coating methods may be used independently or in combination.

First Layer 11 and Second Layer 12

In the photoelectric conversion element, one selected from the first layer 11 and the second layer 12 is a hole transport layer; and the other is an electron transport layer. In the example as described above, the first layer 11 is the hole transport layer; and the second layer 12 is the electron transport layer.

The hole transport layer is a material that receives holes from the active layer (the photoelectric conversion layer 13). The material of the hole transport layer is not constrained as long as the material of the hole transport layer has hole transport properties. The electron transport layer is a material that receives electrons from the active layer. The material of the electron transport layer is not constrained as long as the material has electron transport properties.

The second layer 12 (the electron transport layer) includes at least one selected from a halogen compound and a metal oxide.

LiF, LiCl, LiBr, LiI, NaF, NaCl, NaBr, NaI, KF, KCl, KBr, KI, and CsF are favorable examples of the halogen compound. LiF is more favorable as the halogen compound included in the second layer 12.

Titanium oxide, molybdenum oxide, vanadium oxide, zinc oxide, nickel oxide, lithium oxide, calcium oxide, cesium oxide, and aluminum oxide are favorable examples of the metal oxide. For example, amorphous titanium oxide obtained by hydrolysis of titanium alkoxide by a sol-gel method may be used. Metal calcium or the like is a favorable material in the case where an inorganic substance is used.

The second layer 12 has a function of efficiently transporting electrons. In the case where titanium oxide is used as the material of the second layer 12, it is favorable for the thickness of the second layer 12 to be not less than 5 nm and not more than 100 nm. In the case where the second layer 12 is too thin, Voc (the open circuit voltage) undesirably decreases because pinholes occur easily. In the case where the second layer 12 is too thick, the film resistance becomes large; and the light conversion efficiency decreases because the current that is generated is limited.

A coating method is favorable to form the second layer 12. For example, spin coating, dip coating, casting, bar coating, roll coating, wire-bar coating, spraying, screen printing, gravure printing, flexographic printing, offset printing, gravure-offset printing, dispenser coating, nozzle coating, capillary coating, inkjet, or the like is used. These methods for forming may be used independently or in combination. However, the method for forming the second layer 12 is not particularly limited as long as the method can form a thin film. It is favorable for the solution that is coated to be pre-filtered using a filter. After coating the solution to have a desired thickness, heating and drying are performed using a hotplate, etc. It is favorable for the heating and the drying to be performed at a temperature of not less than 50° C. and not more than 500° C. for not less than about 1 minute and not more than about 10 minutes. The heating and the drying are performed while promoting hydrolysis in air.

The first layer 11 (the hole transport layer) is a doped carrier transport layer. The doped carrier transport layer includes a first substance (a host) and a second substance (a dopant). The concentration of the second substance in the carrier transport layer is lower than the concentration of the first substance in the carrier transport layer.

For example, a p-type organic semiconductor or an n-type organic semiconductor may be used as the material of the first layer 11.

For example, a carbazole, a hydrazone, a styrylamine, a triphenylamine, or the like is favorable as the first substance. Specifically, triphenyl diamine (TPD), N,N'-di(1-naphthyl)-N,N'-diphenylbenzidine (α-NPD), 4,4',4"-tris[phenyl(m-tolyl)amino]triphenylamine (m-MTDATA), 2,2',7,7'-tetrakis-(N,N-di-4-methoxyphenylamino)-9,9'-spirobifluorene (Spiro-OMeTAD), poly(3-hexylthiophene-2,5-diyl) (P3HT), poly(triarylamine)'s (PTAA's), or the like is favorable.

Polythiophene, a derivative of polythiophene, polypyrrole, a derivative of polypyrrole, a pyrazoline derivative, an arylamine derivative, a stilbene derivative, a triphenyldiamine derivative, oligothiophene, a derivative of oligothiophene, polyvinyl carbazole, a derivative of polyvinyl carbazole, polysilane, a derivative of polysilane, a polysiloxane derivative having aromatic amine at a side chain or a main chain, polyaniline, a derivative of polyaniline, a phthalocyanine derivative, porphyrin, a derivative of porphyrin, polyphenylene vinylene, a derivative of polyphenylene vinylene, polythienylene vinylene, a derivative of polythienylene vinylene, a benzodithiophene derivative, a thieno[3,2-b]thiophene derivative, etc., also may be used as the first substance. These substances may be used in combination as the p-type organic semiconductor. A copolymer of these substances also may be used. For example, a thiophene-fluorene copolymer, a phenylene ethynylene-phenylene vinylene copolymer, etc., may be used as the copolymer.

It is favorable to use polythiophene, which is a pi-conjugated conductive polymer, or a derivative of polythiophene as the p-type organic semiconductor. For polythiophene and derivatives of polythiophene, relatively superior stereoregularity can be ensured. The solubility of polythiophene and derivatives of polythiophene in solvents is relatively high. The polythiophene and the derivatives of polythiophene are not particularly limited as long as a compound having a thiophene skeleton is used. Specific examples of polythiophene and derivatives of polythiophene are polyalkylthiophene, polyarylthiophene, polyalkyl isothionaphthene, polyethylene dioxythiophene, etc. Poly(3-methylthiophene), poly(3-butylthiophene), poly(3-hexylthiophene), poly(3-octylthiophene), poly(3-decylthiophene), poly(3-dodecylthiophene), etc., may be used as the polyalkylthiophene. Poly(3-phenylthiophene), poly(3-(p-alkylphenylthiophene)), etc., may be used as the polyarylthiophene. Poly(3-butyl isothionaphthene), poly(3-hexyl isothionaphthene), poly(3-octyl isothionaphthene), poly(3-decyl isothionaphthene), etc., may be used as the polyalkyl isothionaphthene.

In recent years, derivatives of PCDTBT (poly[N-9"-hepta-decanyl-2,7-carbazole-alt-5,5-(4',7'-di-2-thienyl-2',1',3'-benzothiadiazole)]) or the like which are copolymers including carbazole, benzothiadiazole, and thiophene are known as compounds for which excellent conversion efficiency is obtained. A copolymer of a benzodithiophene (BDT) derivative and a thieno[3,2-b]thiophene derivative also is favorable as the first substance. For example, poly [[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), PTB7-Th (having the alternative names of PCE10 and PBDTTT-EFT) to which a thienyl group having electron-donating properties weaker than those of the alkoxy group of PTB7 is introduced, or the like is favorable.

For example, N(PhBr)$_3$SbCl$_6$), Li[CF$_3$SO$_2$]$_2$N, 4-tert-butylpyridine (tBP), or tris[2-(1H-pyrazol-1-yl)pyridine]cobalt (III)tris(hexafluorophosphate) (FK102) is favorable as the second substance.

Spiro-OMeTAD (2,2',7,7'-tetrakis-(N, N-di-4-methoxyphenylamino)-9,9'-spirobifluorene) that includes a dopant may be used as the material of the first layer 11. In other words, the first substance includes Spiro-OMeTAD. The dopant (the second substance) includes, for example, at least one selected from a pyridine compound and acetonitrile (acetonitrile). The pyridine compound includes, for example, 4-tert-butylpyridine (butylpyridine). The dopant may include at least one selected from oxygen, lithium-bis (trifluoromethanesulfonyl)imide (Li-TFSI), tris[2-(1H-pyrazol-1-yl)pyridine]cobalt(III)tris(hexafluorophosphate) (FK102), and tris[2-(1H-pyrazol-1-yl)pyrimidine]cobalt(III) tris[-bis(trifluoromethylsulfonyl)imide](MY11).

The thickness of the first layer 11 is, for example, not less than 2 nm and not more than 1000 nm.

For example, spin coating, dip coating, casting, bar coating, roll coating, wire-bar coating, spraying, screen printing, gravure printing, flexographic printing, offset printing, gravure-offset printing, dispenser coating, nozzle coating, capillary coating, inkjet, or the like is used to form the first layer 11. These methods for forming may be used independently or in combination.

The concentration of the dopant inside the first layer 11 is, for example, not less than 0.1% and not more than 40%.

Intermediate Layer 31

The material of the intermediate layer 31 (the dopant blocking layer) is such that the components included in the carrier transport layer contacting the intermediate layer 31 do not diffuse easily (e.g., have no diffusability). Thereby, the intermediate layer 31 has dopant blocking properties. In other words, the intermediate layer 31 suppresses the diffusion of the dopant of the carrier transport layer toward the photoelectric conversion layer 13.

For example, the concentration in the photoelectric conversion layer 13 of the dopant included in the first layer 11 is analyzed after the completed photoelectric conversion element is placed in a nitrogen gas atmosphere at 90° C. for 1000 hours. Thereby, the dopant blocking properties can be evaluated. In such a case, the dopant itself may be detected; or the amount of the dopant itself may be calculated from an element unique to the dopant or a molecular skeleton unique to the dopant. For example, elemental mapping using a transmission electron microscope (TEM), time-of-flight secondary ion mass spectrometry (time-of-flight secondary ion mass spectrometer (TOF-SIMS)), Auger electron spectrometry, X-ray photoelectron spectroscopy (XPS), etc., can be used to analyze each layer. "To have dopant blocking properties (to suppress the diffusion of the dopant)" substantially means that the concentration (the proportion) of the dopant included in the first layer 11 is maintained at not less than 10 times the concentration of the dopant included in the photoelectric conversion layer 13.

In other words, in the photoelectric conversion element according to the embodiment, the concentration of the dopant in the first layer 11 is not less than 10 times the concentration of the dopant in the photoelectric conversion layer 13 at the initial state of use and after being placed in the nitrogen atmosphere at 90° C. for 1000 hours.

The thickness of the intermediate layer 31 is, for example, not less than 2 nm and not more than 1000 nm. In the case where the intermediate layer 31 is thinner than 2 nm, the dopant blocking properties and the carrier blocking properties (the holes or the electrons) may be insufficient. In the case where the intermediate layer 31 is thicker than 1000 nm, the series resistance becomes large; and the characteristics of the photoelectric conversion element degrade. In the case of a solar cell, the conversion efficiency decreases.

For example, it is favorable for the material of the intermediate layer 31 to use a metal oxide formed by coating a film. At least one selected from titanium oxide, molybdenum oxide, vanadium oxide, zinc oxide, nickel oxide, lithium oxide, calcium oxide, cesium oxide, and aluminum oxide is a favorable example of the metal oxide. The bandgaps of these materials are wide. Therefore, the selectivity of the transport carrier is high. Accordingly, a high fill factor (FF) is obtained easily. Also, the conversion efficiency can be increased. Because the coating is possible at room temperature when these materials are used, the formation of the film also is simple; and there is little damage to the foundation.

To form the intermediate layer 31, it is favorable to use a precursor solution obtained from a metal and hydrogen peroxide. For example, aqueous hydrogen peroxide (30 wt %) is added after dispersing a metal powder of vanadium, molybdenum, or the like in ethanol. After drying in a vacuum for 3 hours, the dried solid is dispersed in ethanol. Thus, the precursor solution can be made. As the precursor solution, it is favorable to use a solution in which vanadium (V) oxytriisopropoxide is dissolved in isopropyl alcohol.

Thiocyanate may be used as the material of the intermediate layer 31. Thiocyanate is a compound that includes a conjugate base of thiocyanic acid. At least one selected from an alkaline metal, an alkaline earth metal, copper, silver, mercury, lead, and a mixture of these metals is the metal used to form the salt. It is favorable for the intermediate layer 31 to include copper thiocyanate.

An example of a method for manufacturing the photoelectric conversion element according to the embodiment will now be described.

Figure 2:
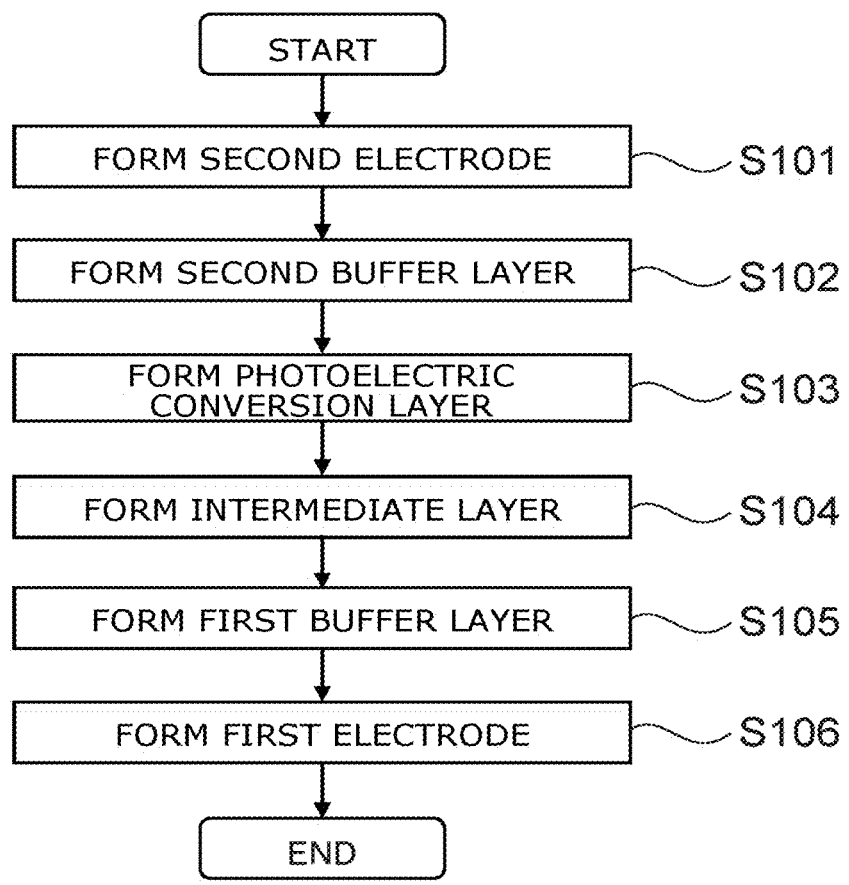
FIG. 2 is a flowchart showing the method for manufacturing the photoelectric conversion element according to the embodiment.

FIG. 2 is a flowchart showing the method for manufacturing the photoelectric conversion element according to the embodiment. The method for manufacturing the photoelectric conversion element according to the embodiment includes step S101 to step S106.

In the example, the substrate 15 includes a glass substrate. The second electrode 20 includes FTO. The second layer 12 which is the electron transport layer includes titanium oxide. The first layer 11 which is the hole transport layer includes a material having Spiro-OMeTAD as a major material. The intermediate layer 31 which is the dopant blocking layer includes vanadium oxide. The photoelectric conversion layer 13 includes methylammonium iodide and lead iodide; and a perovskite layer is formed. The first electrode 10 includes gold.

First, an ITO film is formed as the second electrode 20 on the glass substrate (step S101). Sputtering is used to form the FTO film.

Subsequently, a titanium oxide layer is formed as the second layer 12 on the second electrode 20 (step S102). For example, a titanium oxide layer is formed by coating a titanium di-isopropoxide-bis(acetylacetonate) solution multiple times using spin coating and by baking at 400° C.

Subsequently, the photoelectric conversion layer 13 is formed on the second layer 12 (step S103). For example, the photoelectric conversion layer 13 is formed by coating a DMF (N,N-dimethylformamide) solution using spin coating in a nitrogen atmosphere and by annealing at 90° C. for 3 hours. Here, the DMF solution includes methylammonium iodide and lead iodide. For example, the substance amount (the molar amount) of methylammonium iodide in the DMF solution is equal to the substance amount of lead iodide in the DMF solution.

Subsequently, the intermediate layer 31 is formed on the photoelectric conversion layer 13 (step S104). For example, the intermediate layer 31 is formed by coating a precursor solution of vanadium oxide and by heating in ambient air at 80° C. for 10 minutes. Here, as described above, the precursor solution is made using aqueous hydrogen peroxide.

Subsequently, the first layer 11 that includes Spiro-OMeTAD is formed on the intermediate layer 31 (step S105). The liquid that is coated in the formation of the first layer 11 is a liquid in which 28.5 micro liters (μL) of 4-tert-butylpyridine and 17.5 μL of a lithium-bis(trifluoromethanesulfonyl)imide (Li-TFSI) solution (520 mg of Li-TFSI in 1 ml of acetonitrile) are added to a chlorobenzene solution that includes 80 mg/ml of Spiro-OMeTAD. The first layer 11 is formed by the coating liquid being coated by spin coating and by subsequently being left in dry air for 12 hours.

The first layer 11 is formed by coating after forming the photoelectric conversion layer 13 (and the intermediate layer 31). An unevenness that is caused by the crystal growth of the perovskite is formed in the surface after the formation of the photoelectric conversion layer 13. Therefore, the flatness is improved by setting the first layer (the carrier transport layer) formed on the surface to be relatively thick. On the other hand, in the case where the first layer 11 is too thick, it is difficult to extract the current. Therefore, in the embodiment, doping of the first layer 11 is performed. Thereby, the transport properties of the carriers improve.

Subsequently, the first electrode 10 is formed by vapor-depositing gold on the first layer 11 (step S106).

In the case where PEDOT is used as the material of the first electrode 10, the electrode can be formed by coating by spin coating, etc. It is favorable for the solution that is coated in the formation of the first electrode 10 to be an ethanol aqueous solution. Thereby, the surface tension and permeation of the solution are adjusted. For example, the ethanol aqueous solution that includes PEDOT is coated to have a desired thickness; and subsequently, heating and drying are performed using a hotplate, etc. It is favorable for the heating and the drying to be performed at a temperature of not less than 140° C. and not more than 200° C. for not less than about 1 minute and not more than about 10 minutes.

The photoelectric conversion element according to the embodiment is formed as described above.

For example, the intermediate layer 31 is not included in a photoelectric conversion element 109 of a reference example. In other words, in the photoelectric conversion element 109, the first layer (the hole transport layer) is formed directly on the photoelectric conversion layer. Other than the intermediate layer 31 not being included, the configuration of the photoelectric conversion element 109 according to the reference example is similar to the configuration of the photoelectric conversion element 101 according to the embodiment.

The inventor of the application evaluated the photoelectric conversion element 109 of such a reference example using an endurance test according to JIS C 8938 B-1. In the endurance test, the temperature of the photoelectric conversion element is maintained at a high temperature; and the temporal change of the conversion efficiency is measured. The conversion efficiency of the photoelectric conversion element 109 of the reference example after 1000 hours decreases greatly to, for example, about 10% of the initial state conversion efficiency.

Figure 3:
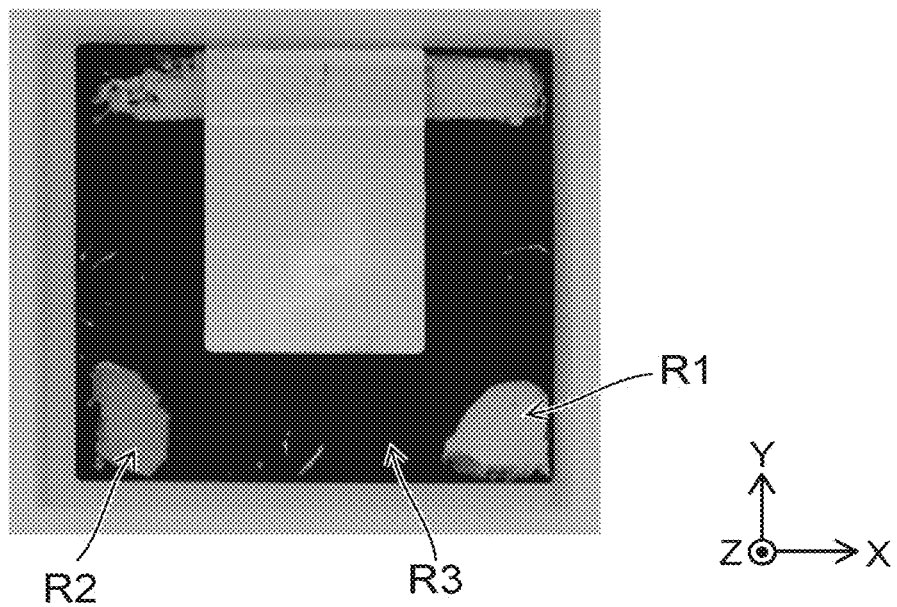
FIG. 3 is a photograph showing the photoelectric conversion element according to the reference example.

FIG. 3 is a photograph showing the photoelectric conversion element according to the reference example.

Region R1 shown in FIG. 3 is a region where 4-tert-butylpyridine is dropped onto the perovskite layer which is the photoelectric conversion layer. Region R2 shown in FIG. 3 is a region where acetonitrile is dropped onto the perovskite layer.

The color of region R1 and the color of region R2 where the dopants of the first layer 11 are dropped are different from the color of region R3 where a dopant is not dropped. This is because the dopants that are dropped dissolve the perovskite layer.

By analyzing the photoelectric conversion element 109 of the reference example having the degraded characteristics due to the endurance test, the inventor of the application found that the dopant that is included in the first layer diffuses to the interior of the perovskite layer which is the photoelectric conversion layer. It is considered that the crystal of the perovskite layer changes and the conversion efficiency degrades due to the diffused dopant. Also, it is considered that the carrier transport properties of the first layer degrade and the conversion efficiency degrades because the dopant desorbs.

Conversely, when an endurance test similar to that of the photoelectric conversion element 109 was performed for the photoelectric conversion element 101 according to the embodiment, the conversion efficiency after 1000 hours is not less than 90% of the initial state conversion efficiency. Compared to the photoelectric conversion element 109 described above, it can be seen from the analysis of the photoelectric conversion element according to the embodiment after performing the endurance test that the amount of the dopant diffusing inside the photoelectric conversion layer 13 is low.

By providing the intermediate layer 31 having the dopant blocking properties, the diffusion of the dopant (e.g., the pyridine compound) of the first layer 11 toward the photoelectric conversion layer 13 can be suppressed. Thus, the durability of the photoelectric conversion element can be improved by providing the intermediate layer 31 between the photoelectric conversion layer 13 and the first layer 11 (the doped carrier transport layer).

When a layer that includes a soluble dopant such as pyridine is coated onto the perovskite layer, a portion of the perovskite layer may be undesirably dissolved. Thereby, the initial efficiency prior to the degradation undesirably decreases. The initial characteristics also can be improved by providing the intermediate layer 31 having the dopant blocking properties.

Figure 4A:
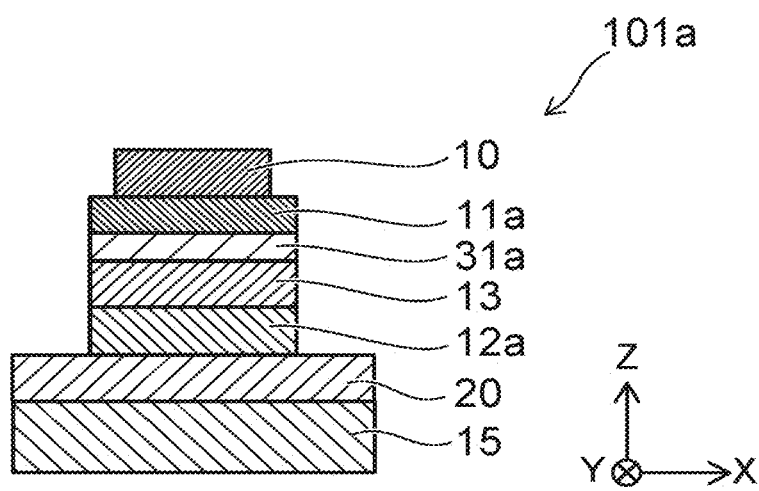
FIG. 4A to FIG. 4C are schematic cross-sectional views showing other photoelectric conversion elements according to the embodiment.
Figure 4B:
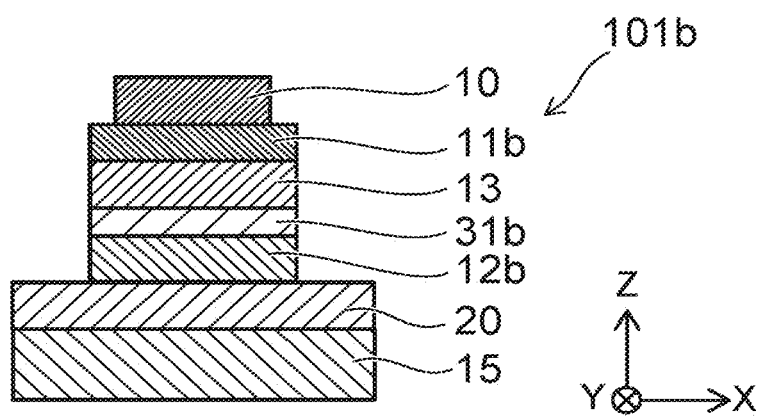
Figure 4C:
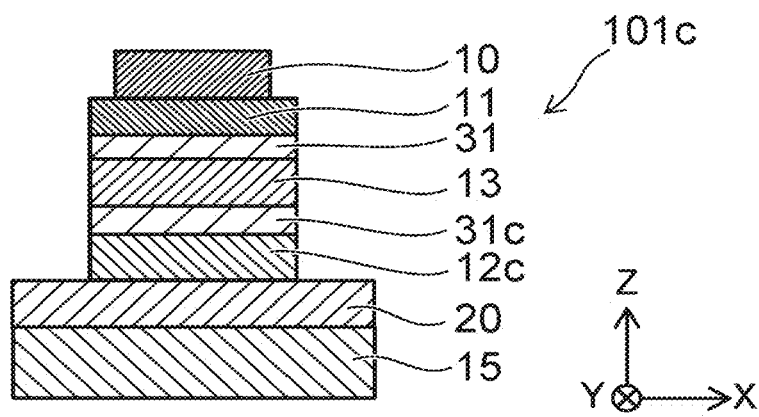

FIG. 4A to FIG. 4C are schematic cross-sectional views showing other photoelectric conversion elements according to the embodiment. FIG. 4A to FIG. 4C show cross sections in the Z-X plane of the photoelectric conversion elements 101a to 101c according to the embodiment.

As shown in FIG. 4A, the photoelectric conversion element 101a includes the substrate 15, the first electrode 10, and the second electrode 20. A description similar to the description of the photoelectric conversion element 101 is applicable to these components. The photoelectric conversion element 101a further includes a first layer 11a, a second layer 12a, and an intermediate layer 31a.

The first layer 11a is provided between the first electrode 10 and the photoelectric conversion layer 13. The first layer 11a is an electron transport layer. The electrons that are excited in the photoelectric conversion layer 13 are extracted from the first electrode 10 via the first layer 11a. In the example, the first layer 11a is a doped carrier transport layer.

The second layer 12a is provided between the second electrode 20 and the photoelectric conversion layer 13. The second layer 12a is a hole transport layer. The holes that are excited in the photoelectric conversion layer 13 are extracted from the second electrode 20 via the second layer 12a.

The intermediate layer 31a is provided between the photoelectric conversion layer 13 and the first layer 11a. The intermediate layer 31a is a dopant blocking layer that suppresses the diffusion of the dopant of the first layer 11a toward the photoelectric conversion layer 13.

In the photoelectric conversion element 101a as well, the dopant blocking layer is provided between the photoelectric conversion layer 13 and the doped carrier transport layer. Thereby, the diffusion of the dopant of the carrier transport layer into the photoelectric conversion layer 13 is suppressed; and the durability of the photoelectric conversion element can be improved.

As shown in FIG. 4B, the photoelectric conversion element 101b includes the substrate 15, the first electrode 10, and the second electrode 20. A description similar to the description of the photoelectric conversion element 101 is applicable to these components. The photoelectric conversion element 101b further includes a first layer 11b, a second layer 12b, and an intermediate layer 31b.

The first layer 11b is provided between the first electrode 10 and the photoelectric conversion layer 13. In the example, the first layer 11b is an electron transport layer. For example, the material of the first layer 11b is similar to that of the electron transport layer of the photoelectric conversion element 101.

The second layer 12b is provided between the second electrode 20 and the photoelectric conversion layer 13. The second layer 12b is a hole transport layer. The second layer 12b is a doped carrier transport layer. For example, the material of the second layer 12b is similar to that of the hole transport layer of the photoelectric conversion element 101.

The intermediate layer 31b is provided between the photoelectric conversion layer 13 and the second layer 12b. The intermediate layer 31b suppresses the diffusion of the dopant of the second layer 12b toward the photoelectric conversion layer 13. For example, the material of the intermediate layer 31b is similar to that of the dopant blocking layer of the photoelectric conversion element 101. Thus, in the embodiment, the doped transport layer and the dopant blocking layer may be provided on the substrate 15 side as viewed from the photoelectric conversion layer 13.

As shown in FIG. 4C, the photoelectric conversion element 101c includes the substrate 15, the first electrode 10, the second electrode 20, the first layer 11, the intermediate layer 31, and the photoelectric conversion layer 13. A description similar to the description of the photoelectric conversion element 101 is applicable to these components.

The photoelectric conversion element 101c further includes a second layer 12c and an intermediate layer 31c. The second layer 12c is a doped electron transport layer. The material of the second layer 12c is similar to the first layer 11a described in reference to FIG. 4A. The intermediate layer 31c is a dopant blocking layer that suppresses the diffusion of the dopant of the second layer 12c toward the photoelectric conversion layer 13. The material of the intermediate layer 31c is similar to the intermediate layer 31a described in reference to FIG. 4A.

Thus, in the embodiment, both the hole transport layer and the electron transport layer may be carrier transport layers that include a dopant. In such a case, the intermediate layer is provided between the photoelectric conversion layer 13 and each of the carrier transport layers. Thereby, the diffusion of the dopant of the carrier transport layer is suppressed; and the durability of the photoelectric conversion element can be improved.

According to the embodiment, a photoelectric conversion element and a method for manufacturing the photoelectric conversion element can be provided in which the durability can be improved.

In this specification, "perpendicular" and "parallel" include not only strictly perpendicular and strictly parallel but also, for example, the fluctuation due to manufacturing processes, etc.; and it is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components such as the photoelectric conversion layer, the first layer, the second layer, the intermediate layer, the electrode, the substrate, etc., from known art; and such practice is within the scope of the invention to the extent that similar effects can be obtained.

Any two or more components of the specific examples may be combined within the extent of technical feasibility and are within the scope of the invention to the extent that the spirit of the invention is included.

All photoelectric conversion elements practicable by an appropriate design modification by one skilled in the art based on the photoelectric conversion elements described above as embodiments of the invention are within the scope of the invention to the extent that the spirit of the invention is included.

Various modifications and alterations within the spirit of the invention will be readily apparent to those skilled in the art; and all such modifications and alterations should be seen as being within the scope of the invention.

Although several embodiments of the invention are described, these embodiments are presented as examples and are not intended to limit the scope of the invention. These novel embodiments may be implemented in other various forms; and various omissions, substitutions, and modifications can be performed without departing from the spirit of the invention. Such embodiments and their modifications are within the scope and spirit of the invention and are included in the invention described in the claims and their equivalents.

What is claimed is:

1. A photoelectric conversion element, comprising:
a first electrode including a first face;
a second electrode including a second face substantially parallel to the first face;
a photoelectric conversion layer provided between the first face and the second face, the photoelectric conversion layer substantially parallel to the first face, the photoelectric conversion layer including a material having a perovskite structure;
a first layer provided between the photoelectric conversion layer and the first face, the first layer being substantially parallel to the first face, the first layer including a first substance and a second substance; and
an intermediate layer provided between the photoelectric conversion layer and the first layer, the intermediate layer being substantially parallel to the first layer,
a concentration of the second substance in the first layer being lower than a concentration of the first substance in the first layer,
wherein
the intermediate layer includes at least one selected from the group consisting of a metal oxide and thiocyanate,
the first substance includes at least one selected from a group consisting of a carbazole derivative, a hydrazone derivative, a styrylamine derivative, a triphenylamine derivative, a polythiophene derivative, a polypyrrole derivative, a pyrazoline derivative, an arylamine derivative, a stilbene derivative, a triphenyldiamine derivative, a oligothiophene derivative, polyvinyl carbazole derivative, polysilane derivative, a polysiloxane derivative, a polyaniline derivative, a phthalocyanine derivative, a porphyrin derivative, polyphenylene vinylene derivative, a polythienylene vinylene derivative, a thieno[3,2-b]thiophene derivative, a benzodithiophene derivative, and a copolymer, and
the second substance includes at least one selected from acetonitrile, N(PhBr)$_3$SbCl$_6$, Li[CF$_3$SO$_2$]$_2$N, tris[2-(1H-pyrazol-1-yl)pyridine]cobalt(III)tris(hexafluorophosphate) (FK102) and tris[2-(1H-pyrazol-1-yl)pyrimidine]cobalt(III) tris[-bis(trifluorom ethylsulfonyl)imide] (MY11).

2. The element according to claim 1, wherein the intermediate layer has hole transport properties.

3. The element according to claim 1, wherein the metal oxide includes at least one selected from titanium oxide, molybdenum oxide, vanadium oxide, zinc oxide, nickel oxide, lithium oxide, calcium oxide, cesium oxide, and aluminum oxide.

4. The element according to claim 1, wherein the first substance includes Spiro-OMeTAD.

5. The element according to claim 1, wherein the material having the perovskite structure is A1A2X3, where
the A1 includes CH$_3$NH$_3$,
the A2 includes at least one selected from Pb and Sn, and
the X includes at least one selected from Cl, Br, and I.

6. The element according to claim 1, wherein the first electrode includes polyethylene dioxythiophene.

7. The element according to claim 6, further comprising a second layer,
the second layer being provided between the second electrode and the photoelectric conversion layer.

8. The element according to claim 7, wherein the second layer includes at least one selected from a halogen compound and metal oxide.

9. The element according to claim 1, wherein the copolymer includes at least one selected from a group consisting of a carbazole derivative, a hydrazone derivative, a styrylamine derivative, a triphenylamine derivative, a polythiophene derivative, a polypyrrole derivative, a pyrazoline derivative, an arylamine derivative, a stilbene derivative, a triphenyldiamine derivative, a oligothiophene derivative, polyvinyl carbazole derivative, polysilane derivative, a polysiloxane derivative, a polyaniline derivative, a phthalocyanine derivative, a porphyrin derivative, polyphenylene vinylene derivative, a polythienylene vinylene derivative, and a thieno[3,2-b]thiophene derivative.

10. The element according to claim 1, wherein the first substance includes at least one selected from triphenyl diamine (TPD), N,N'-di(1-naphthyl)-N,N'-diphenylbenzidine (α-NPD), 4,4',4"-tris[phenyl(m-tolyl)amino]triphenylamine (m-MTDATA), 2,2',7,7'-tetrakis-(N,N-di-4-methoxyphenylamino)- 9,9'-spirobifl uorene (Spiro-OMeTAD), poly(3-hexylthiophene-2,5-diyl) (P3HT), poly(triarylamine)'s (PTAA's), polyalkylthiophene, polyarylthiophene, polyalkyl isothinaphthene, polyethylene dioxythiophene, Poly(3-methylthiophene), poly(3-butylthiophene), poly(3-hexylthiophene), poly(3-octylthiophene), poly(3-decylthiophene), poly(3-dodecylthiophene), Poly(3-phenylthiophene), poly(3-(p-alkylphenylthiophene)), polyarylthiophene, Poly(3-butyl isothionaphthene), poly(3-hexyl isothionaphthene), poly(3-octyl isothionaphthene), poly(3-decyl isothionaphthene), derivatives of poly[N-9"-hepta-decanyl-2,7-carbazole-alt-5,5-(4',7'-di-2-thienyl-2',1',3'-benzothiadiazole)] (PCDTBT), poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7), and PTB7-Th.

11. The element according to claim 1, wherein the photoelectric conversion layer further includes the second substance, and
   the concentration of the second substance in the first layer is not less than 10 times a concentration of the second substance in the photoelectric conversion layer.

12. The element according to claim 11, wherein the concentration of the second substance in the first layer is not less than 10 times the concentration of the second substance in the photoelectric conversion layer after being placed in a nitrogen atmosphere at 90° C. for 1000 hours.

13. The element according to claim 1, wherein the intermediate layer includes dopant blocking properties to suppress diffusion of dopants of the first layer toward the photoelectric conversion layer.

* * * * *